United States Patent
Noy

(10) Patent No.: US 6,684,359 B2
(45) Date of Patent: Jan. 27, 2004

(54) SYSTEM AND METHOD FOR TEST GENERATION WITH DYNAMIC CONSTRAINTS USING STATIC ANALYSIS

(75) Inventor: Amos Noy, Jerusalem (IL)

(73) Assignee: Verisity Ltd., Rosh Ha'ayin (IL)

( * ) Notice: Subject to any disclaimer, the term of this patent is extended or adjusted under 35 U.S.C. 154(b) by 430 days.

(21) Appl. No.: 09/799,066

(22) Filed: Mar. 6, 2001

(65) Prior Publication Data

US 2002/0166089 A1 Nov. 7, 2002

Related U.S. Application Data

(60) Provisional application No. 60/245,146, filed on Nov. 3, 2000.

(51) Int. Cl.[7] .................. G01R 31/28; G01F 11/00; G06F 9/45
(52) U.S. Cl. .............. 714/741; 714/33; 703/26
(58) Field of Search ............ 714/741, 33, 738; 395/500; 707/14; 703/26

(56) References Cited

U.S. PATENT DOCUMENTS

| | | | | |
|---|---|---|---|---|
| 5,377,201 A | * | 12/1994 | Chakradhar et al. | 714/741 |
| 5,479,414 A | * | 12/1995 | Keller et al. | 714/726 |
| 6,006,028 A | * | 12/1999 | Aharon et al. | 703/21 |
| 6,141,630 A | * | 10/2000 | McNamara et al. | 703/14 |
| 6,178,533 B1 | * | 1/2001 | Chang | 714/739 |
| 6,182,258 B1 | * | 1/2001 | Hollander | 714/739 |
| 6,212,667 B1 | * | 4/2001 | Geer et al. | 716/6 |
| 6,341,361 B1 | * | 1/2002 | Basto et al. | 714/726 |
| 6,347,388 B1 | * | 2/2002 | Hollander | 714/739 |
| 6,467,058 B1 | * | 10/2002 | Chakradhar et al. | 714/745 |
| 6,484,135 B1 | * | 11/2002 | Chin et al. | 703/23 |

FOREIGN PATENT DOCUMENTS

WO      98/55879      12/1998

OTHER PUBLICATIONS

Aharon et al, "Verification of the IBM RISC System/6000 by a Dynamic Biased Pseudo–Random Test Program Generator", *IBM Systems J.*, 30(4):527–538, 1991.

Biswas et al, "Functional Verification of the Superscalar SH–4 Microprocessor", *Proc. IEEE San Jose, CA, USA Feb. 23–26, 1997, Los Altimos CA, USA, IEEE Comput. SOC. US*, Feb. 23, 1997, pp 115–120.

Freuder et al, "Partial Constraint Satisfaction", *Artificial Intelligence* vol. 58(1–3), pp 21–70, 1992.

Hower et al, "Experimental Results in Constraint Relaxation", Krzysztof R. et al. (editors): "Proceedings of the Joint Workshop of the ERCIM Working Group on Constraints and the CologNet area on Constraint and Logic Programming", pp. 153–168, Cork, 2002.

Weigel et al, "Compoling Constraint Satisfaction Problems", *Artificial Intelligence*, 115, 1999, pp. 257–287.

Lewin et al., "A Methodology for Processor Implementation Verification", Proceedings of the 1st international Conf. on Formal Methods in Computer–Aided Design, LNCS vol. 1166, pp. 126–142, 1997.

\* cited by examiner

*Primary Examiner*—Phung M. Chung
*Assistant Examiner*—Esaw Abraham
(74) *Attorney, Agent, or Firm*—A.E.Ehrlich (1995) Ltd.

(57) ABSTRACT

A system and method for testing the quality of a simulation model for the DUT (device under test) with dynamic constraint solving and test generation for the testing and verification process. The present invention provides such dynamic constraint solving through the creation of a sequence of instructions in a "generator mini-language" (GML). These instructions are then executed in order to provide a correct random solution to any given set of dynamic constraints. The process of execution is preferably performed by a constraint resolution engine, optionally and more preferably implemented as software, which manages the requirements imposed by the constraints on the execution, while simultaneously enabling a random solution to the set of constraints to be provided. Such a constraint resolution engine may optionally be viewed as a type of state machine, in which individual elements of the state machine are more preferably represented by one or more dynamic graph(s).

12 Claims, 3 Drawing Sheets coverage feedback

SYSTEM AND METHOD FOR TEST GENERATION WITH DYNAMIC CONSTRAINTS USING STATIC ANALYSIS

This application claims the benefit of Provisional Application No. 60/245,146, filed Nov. 3, 2000.

FIELD AND BACKGROUND OF THE INVENTION

The present invention relates to a system and method for test generation with dynamic constraints, and in particular, to a system and method for dynamically solving constraints by creating a set of instructions which provide a specific, random solution when executed.

Design verification is the process of determining whether an integrated circuit, board, or system-level architecture, exactly implements the requirements defined by the specification of the architecture for that device. Design verification for a device under testing (DUT) may be performed on the actual device, or on a simulation model of the device. For the purposes of explanation only and without intending to be limiting in any way, the following discussion centers upon testing which is performed on simulation models of the device.

As designs for different types of devices and device architectures become more complex, the likelihood of design errors increases. However, design verification also becomes more difficult and time consuming, as the simulation models of the design of the device also become more complex to prepare and to test.

The problem of design verification is compounded by the lack of widely generalizable tools which are useful for the verification and testing of a wide variety of devices and device architectures. Typical background art verification methods have often been restricted to a particular device having a specific design, such that the steps of preparing and implementing such verification methods for the simulation model must be performed for each new device.

The process of verifying a design through a simulation model of the device is aided by the availability of hardware description languages such as Verilog and VHDL. These languages are designed to describe hardware at higher levels of abstraction than gates or transistors. The resultant simulated model of the device can receive input stimuli in the form of test vectors, which are a string of binary digits applied to the input of a circuit. The simulated model then produces results, which are checked against the expected results for the particular design of the device. However, these languages are typically not designed for actual verification. Therefore, the verification engineer must write additional programming code in order to interface with the models described by these hardware description languages in order to perform design verification of the device.

Examples of testing environments include static and dynamic testing environments. A static testing environment drives pre-computed test vectors into the simulation model of the DUT and/or examines the results after operation of the simulation model. In addition, if the static testing environment is used to examine the results which are output from the simulation model, then errors in the test are not detected until after the test is finished. As a result, the internal state of the device at the point of error may not be determinable, requiring the simulation to be operated again in order to determine such internal states. This procedure consumes simulation cycles, and can require the expenditure of considerable time, especially during long tests.

A more useful and efficient type of testing is a dynamic testing environment.

For this type of environment, a set of programming instructions is written to generate the test vectors in concurrence with the simulation of the model of the DUT and while potentially being controlled by the state feedback of the simulated device. This procedure enables directed random generation to be performed and to be sensitive to effects uncovered during the test itself on the state of the simulation model of the device. Thus, dynamic test generation clearly has many advantages for design verification.

Within the area of testing environments, both static and dynamic testing environments can be implemented only with fixed-vector or pre-generation input. However, a more powerful and more sophisticated implementation uses test generation to produce the environment.

One example of such a test generator is disclosed in U.S. patent application Ser. No. 09/020,792, filed on Feb. 6, 1998, incorporated by reference as if fully set forth herein. This test generation procedure interacts with, and sits as a higher level over, such hardware description languages as Verilog and VHDL. The test generation procedure is written in a hardware-oriented verification specific object-oriented programming language. This language is used to write various tests, which are then used to automatically create a device verification test by a test generator module. A wide variety of design environments can be tested and verified with this language. Thus, the disclosed procedure is generalizable, yet is also simple to program and to debug by the engineer.

The disclosed language features a number of elements such as structs for more richly and efficiently describing the design of the device to be simulated by the model. Unfortunately, the disclosed language and resultant test generation environment does not include features for providing a good, random solution for dynamic constraints in a reasonable processing time, and also cannot react dynamically on the same scale as the time period which is actually required for simulation. Furthermore, such features are also not known in the background art, which handles such constraints with a non-random solution.

Therefore, there is an unmet need for, and it would be highly useful to have, a system and method for solving dynamic constraints through a specific, random but correct solution, which would be created by executing a specific set of instructions.

SUMMARY OF THE INVENTION

The system and method of the present invention tests the quality of a simulation model for the DUT (device under test) with dynamic constraint solving and test generation for the testing and verification process. The present invention provides such dynamic constraint solving through the creation of a sequence of instructions in a "generator mini-language" (GML). These instructions are then executed in order to provide a correct random solution to a given set of dynamic constraints. The process of execution is preferably performed by a constraint resolution engine, optionally and more preferably implemented as software, which manages the requirements imposed by the constraints on the execution, while simultaneously enabling a random solution to the set of constraints to be provided. Such a constraint resolution engine may optionally be viewed as a type of state machine, in which individual elements of the state machine are more preferably represented by one or more dynamic graph(s).

According to the present invention, there is provided a system for dynamically solving constraints for test generation for a DUT (device under test), comprising: (a) a data model for the DUT; (b) an abstract generation machine for solving the constraints by creating a plurality of static instructions; and (c) a test generator for performing test generation according to the plurality of static instructions and according to the data model.

According to another embodiment of the present invention, there is provided a method for dynamically solving a plurality of dynamic constraints for test generation for a DUT (device under test), each constraint featuring at least one parameter, the steps of the method being performed by a data processor, the method comprising the steps of: (a) creating at least one dynamic graph for describing the plurality of dynamic constraints, each node of the at least one dynamic graph representing a constraint or a parameter, and each edge representing a relationship between constraints; (b) reducing a number of nodes for the at least one dynamic graph; and (c) determining a path for traveling through the at least one dynamic graph to create a plurality of instructions for solving the dynamic constraints.

Hereinafter, the term "computing platform" refers to a particular computer hardware system or to a particular software operating system. Examples of such hardware systems include, but are not limited to, personal computers (PC), Macintosh™ computers, mainframes, minicomputers and workstations. Examples of such software operating systems include, but are not limited to, UNIX, VMS, Linux, MacOS™, DOS, FreeBSD, one of the Windows™ operating systems by Microsoft Inc. (USA), including Windows NT™, Windows95™, Windows98™ and Windows 2000™.

The method of the present invention could also be described as a plurality of instructions being performed by a virtual or actual data processor, such that the method of the present invention could be implemented as hardware, software, firmware or a combination thereof. For the present invention, a software application could be written in substantially any suitable programming language, which could easily be selected by one of ordinary skill in the art. The programming language chosen should be compatible with the computing platform according to which the software application is executed. Examples of suitable programming languages include, but are not limited to, C, C++ and Java.

Hereinafter, the term "non-random" refers to a process, or an entity selected by the process, which is not random but which is not necessarily deterministic.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
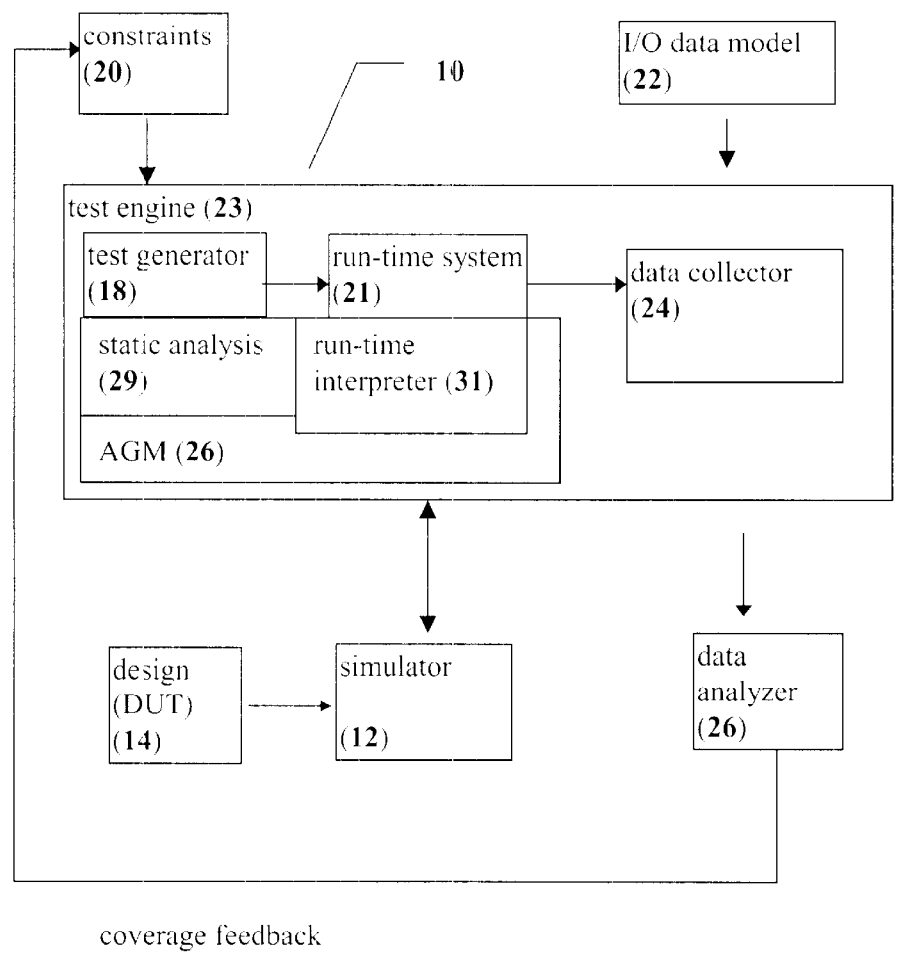
FIG. 1 is a schematic block diagram illustrating an exemplary system according to the present invention.

The system and method of the present invention tests the quality of a simulation model for the DUT (device under test) with dynamic constraint solving and test generation for the testing and verification process. The present invention provides such dynamic constraint solving through the creation of a sequence of instructions in a "generator mini-language" (GML). These instructions are then executed in order to provide a correct random solution to any given set of dynamic constraints. The process of execution is preferably performed by a constraint resolution engine, optionally and more preferably implemented as software, which manages the requirements imposed by the constraints on the execution, while simultaneously enabling a random solution to the set of constraints to be provided. Such a constraint resolution engine may optionally be viewed as a type of state machine, in which individual elements of the state machine are more preferably represented by one or more dynamic graph(s).

The constraint resolution engine of the present invention enables the process of resolving constraints to be at least partially performed before run-time, in the static analysis stage, thereby making the process of constraint resolution both more effective and more efficient. A set of instructions is then prepared for execution during run-time by the constraint resolution engine. Thus, unlike the background art, which requires constraint resolution to occur during run-time, the present invention is capable of separating the process of constraint resolution into two stages: during static analysis (before run-time), after which a set of instructions is prepared; and during run-time, when these instructions are executed.

According to preferred embodiments of the present invention, the state machine has two components. The first component is an order manager functional unit, which preferably maintains a dynamic graph with bi-directional and uni-directional edges. This dynamic graph is more preferably used to determine the order of incorporation of each constraint into the executed instructions, according to the order which is implied between the nodes of the graph. This order in turn is more preferably determined according to the set of provided constraints at generation time.

The second component of the state machine is preferably implemented as a dependency graph manager, which optionally and preferably maintains a dynamic bi-partite graph relating nodes and constraints. Each node represents field ranges which can be generated. The dependency graph manager uses this dynamic graph to maintain the consistency of ranges of the set of provided constraints, which are described by the graph. Optionally and more preferably, the dependency graph manager is able to reduce the number of relationships which must be examined to maintain consistency through the use of reduction mechanisms. These reduction mechanisms are a method for maintaining sets of consistent values across ranges of possible values for the constraints.

The combination of the interactions of the order manager and the dependency graph manager drive the actions of the state machine. In turn, these actions enable the constraints to be statically analyzed, such that rather than attempting to provide a general absolute solution to a dynamic set of constraints, a single specific random solution is provided which nonetheless fulfills the requirements of the constraints. This solution is embodied as a set of specific instructions to be performed by the state machine.

The advantage of the present invention is that the static analysis of the constraints, and therefore the static production of the set of instructions, enables many complex operations to be performed once, during the stage of static analysis, rather than at run-time for actually generating the particular instance for the test generation. In addition, the set of instructions can itself optionally be analyzed in order to optimize the execution of the instructions. These advantages are available in background art methods and systems, which require constraint resolution to occur at run-time.

Further advantages of the present invention include the optional but preferred ability to translate the sequence of instructions into a plurality of different computer programming languages and/or for execution on different types of hardware, such as "C" or "C++" for example, which is useful for the testing of the DUT in different applications. In addition, the sequences of instructions can optionally be debugged more easily, similar to regular computer program code.

The principles and operation of the system and method according to the present invention may be better understood with reference to the drawings and the accompanying description.

Referring now to the drawings, FIG. 1 is a schematic block diagram illustrating an exemplary system according to the present invention for test generation. It should be noted that the illustrated system only includes those general functions of the test generation procedure which are required for the description of the present invention. A more complete description of the entire test generation procedure may be found in U.S. patent application Ser. No. 09/020,792, previously incorporated by reference. It should also be noted that although the present invention is described in the context of a simulation model, the present invention is also useful for verification of a physical device. Both the physical device and the simulation model can be described as a DUT (device under test), which is in a test environment.

A test generation system 10 features a simulator 12, which may accept a design 14 for the device under test (DUT), written in a hardware descriptive language such as Verilog or VHDL. In addition, simulator 12 interacts with a test engine 16 for performing the test generation procedure at run-time. The interaction between simulator 12 and test engine 16 is shown as bi-directional, since test engine 16 provides input to simulator 12, and in turn receives the results from simulator 12 as input for further operation.

Test engine 16 features a test generator 18, connected to a run-time system 21 for testing DUT 14 at run-time. Test generator 18 receives a set of constraints 20 and an I/O data model 22, and then performs the testing and verification of DUT 14. According to the present invention, constraints 20 include at least one set of a plurality of dynamic constraints, which are then solved according to the method of the present invention, as described in greater detail below. Run-time system 21 both drives and samples simulator 12 during the run-time testing procedure.

In order for the dynamic constraints portion of constraints 20 to be solved, test generator 18 preferably includes an AGM (abstract generation machine) module 26. AGM module 26 creates a sequence of instructions in a "generator mini-language" (GML). These instructions are then executed in order to provide a correct random solution to any given set of dynamic constraints. Briefly, a static analysis module 29 preferably performs an initial analysis of the dynamic constraints before run-time, in cooperation with test generator 18. This initial analysis preferably produces a set of instructions for generating the correct, random solution. Next, a run-time interpreter module 31 preferably receives these instructions, and executes them in conjunction with run-time system 21. A more detailed description of AGM module 26 is provided with regard to FIG. 2 below.

During the process of testing and verification, a data collector 24 requests the values for one or more variables from run-time system 21. These requests are optionally performed according to a triggering event emitted by run-time system 21. For example, for collection of data related to temporal coverage, such a triggering event is optionally a fixed, predefined sampling time and/or the occurrence of a temporal pattern of state transitions as defined by a temporal expression given in a temporal language, for example. Data collector 24 is able to communicate with test generator 18 and to access the requested data through the API (application programming interface) for test generator 18. Such an API specifies the software function calls required in order to collect the desired data. This collected data is then analyzed by a data analyzer 26.

According to a preferred embodiment of the present invention, constraints 20 and I/O data model 22 are preferably constructed in e code, which is the code language provided by the Specman™ functional programming environment (Verisity Design, Inc., Mountain View, Calif., USA) and disclosed in U.S. patent application Ser. No. 09/020,792. Such an embodiment is preferred because of the ease and flexibility of programming in e code.

The e code language is a hardware-oriented verification specific object-oriented programming language. Objects in this language are instances of "structs", which contain a field, and one or more functions, or methods, which operate on data stored within the field and which interact with other objects. Optionally, a constraint can operate on the field, thereby altering the data stored in the field, for example by restricting the range of possible values for the data. The field can also be used to store more complex structures, including other structs and lists of scalars or structs.

The process of test generation fills data elements, including structs and fields, with random values. The possible data values for each element can optionally be limited by constraints, which provide the direction for the directed test generation. For dynamic constraints, as described in greater detail with regard to FIG. 2 below, a selected, specific solution is provided according to the present invention for each instance of test generation. This solution is then used to provide limitations on the generated data values.

Figure 2:
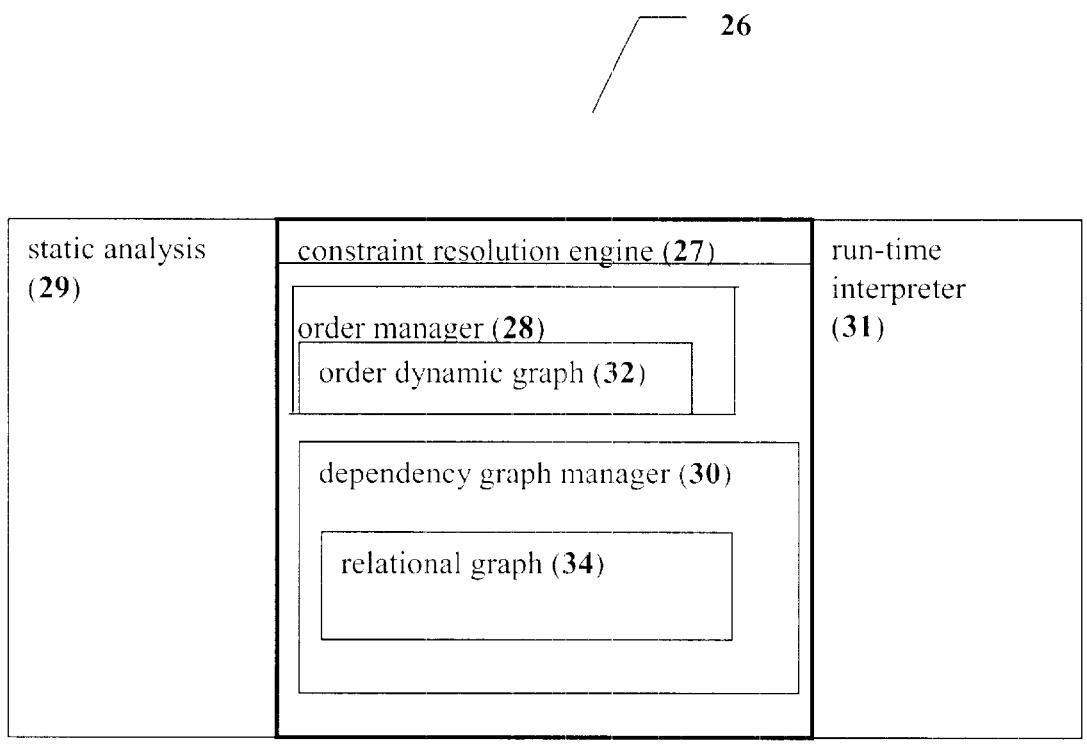
FIG. 2 is a schematic block diagram of a more detailed illustrative AGM from FIG. 1.

Turning now to FIG. 2, the schematic block diagram shows an exemplary but preferred implementation of AGM module 26 from FIG. 1. As shown, AGM module 26 preferably features a constraint resolution engine 27, in addition to static analysis module 29 and run-time interpreter 31. Constraint resolution engine 27 enables the process of resolving constraints to be at least partially performed before run-time, in the static analysis stage, thereby making the process of constraint resolution both more effective and more efficient. A set of instructions is then prepared for execution during run-time by constraint resolution engine 27. Thus, unlike the background art, which requires constraint resolution to occur during run-time, the present invention is capable of separating the process of constraint resolution into two stages: during static analysis (before run-time), after which a set of instructions is prepared; and during run-time, when these instructions are executed.

According to preferred embodiments of the present invention, constraint resolution engine 27 may optionally and preferably feature an order manager 28 and a dependency graph manager 30. Briefly, static analysis module 29 performs the initial analysis of the constraints for creating a set of instructions for execution in order to create the random solution, while run-time interpreter 31 executes these instructions.

Order manager 28 preferably maintains a dynamic graph 32 with bi-directional and unidirectional edges. Dynamic graph 32 is more preferably used to determine the order of incorporation of the instruction representing each constraint, according to the order which is implied between the nodes of dynamic graph 32. This order in turn is more preferably determined according to the set of provided constraints. Each node represents an instruction to be executed. Each instruction is in turn created according to the relationships between constraints, as determined by dependency graph manager 30.

Dependency graph manager 30 in turn optionally and preferably maintains a dynamic bi-partite relational graph 34 relating nodes and constraints. Each node represents field ranges for specific variables, for which particular values can be generated as part of the test generation process. Dependency graph manager 30 uses relational graph 34 in a process by which the consistency of ranges of legal values of the set of provided constraints is maintained, which is part of the reducing mechanism. Optionally and more preferably, dependency graph manager 30 is able to reduce the number of relationships which must be examined to maintain consistency.

Order manager 28 and dependency graph manager 30 together preferably create a static series of instructions according to commands from static analysis module 29, which, when executed by run-time interpreter 31, provide a solution to the set of constraints. This solution is more preferably provided as a set of values for variables. As previously described, if the e language is used to describe the constraints and the data model for test generation, then these values may optionally include data elements such as scalars, structs and fields.

According to preferred embodiments of the present invention, specific instructions for order manager 28 optionally include, but are not limited to, management of the generation of value(s) for a struct according to the set of dynamic constraints, with one frame being generated per struct. These commands include the OM_start_frame command to start the generation process for a particular struct, and the OM_close_frame command to end the generation process for this struct; OM_create_nodes for creating order graph nodes for a given set of nodes for the struct from the static analysis procedure; OM_create_edges for creating order graph edges for a given set of nodes; OM_get_next for returning the next node in the maintained order of the graph.

Specific instructions for dependency graph manager 30 optionally include, but are not limited to, DGM_create_constraint for creating a constraint node and parameter nodes in relational graph 34, in which the parameter nodes are those entities or parameters related by the constraints; DGM_mark_as_changed for marking a set of parameter nodes as having their range changed; DGM_update_consistent_ranges for applying the reduction mechanism to a set of parameter nodes, thereby maintaining consistency of the ranges of possible values between constraint nodes; DGM_test_consistency for checking a conditional constraint to see if the value should be true or false in the current version of relational graph 34; and DGM_expand_struct for replacing a node representing a struct by a set of nodes representing the fields of the struct, such that any constraint edges for the old node now point to the new node.

According to other preferred embodiments of the present invention, the AGM is used to create "roles". When creating a GML sequence for a role, some of the previously described operations are grouped into higher level instructions. Each such group then forms an example of a role. Roles enable instructions to be executed at run time according to such groups, which has the advantage of providing correct, random solutions to the dynamic constraints in a more efficient manner. In particular, roles enable the same struct type to optionally be generated in different contexts, with different constraints applicable to the struct and to the descendants of struct. Thus, the role is a representation of the context in which the struct is to be handled in set of generated instructions.

Roles are optionally and more preferably either statically unordered or ordered, according to the manner in which the instructions are to be executed at run time in order to form the correct random solution to the dynamic constraints.

Roles are preferably used in order to simplify the situation in which a struct type might be generated in different contexts, with different constraints applicable to it and its descendants. A generation role is a conceptualization of this need for a "struct-type in context", or for being able to define the struct according to the context, such that the struct type is correctly generated according to both the definition of the struct and the context in which the struct is generated.

Static analysis according to the present invention optionally and preferably identifies such roles, and constructs a complex data structure for representing and manipulating them. For example, in the context of the previously described e code, assume that a struct of type S is defined, and the following field definitions are used for defining another struct 'sys':

```
extend sys {
    s1: S;
    keep s1.j == 3;
    s2: S;
    keep s2.j > 100;
};
```

It can be seen from the above example that the fields s1 and s2 share the same struct type S, but have different generation roles. The first field s I is of the role <sys.s1>, in which its field 'j' is constrained to be equal to 3, while the field 's2' is generated in the context of the role <sys.s2>, in which its field 'j' is constrained to be more than 100.

Thus, the same struct type might be mapped into many different roles when generated Generation roles therefore encapsulate the following information for a struct-type: relevant fields; applicable constraints; initial ranges; ordering edges. Relevant fields are a list of generatable fields, or fields which can be generated, of that type in this role. Applicable constraints are a list of constraints which are to be applied to fields in this role. Initial ranges are statically inferred ranges, or sets of possible values, of the relevant fields. Ordering edges are the set of edges for determining the order in which constraints are applied and which are implied by uni- and bi-directional (applicable) constraints between relevant fields.

The above information is optionally and more preferably used to derive a Generation Mini-Language program for each role at the static analysis phase. This program preferably features code which can be executed at the time of generation run-time, thus capturing the necessary constraints in a correct but random solution to the problem of applying dynamic constraints at run-time.

Examples of different types of instructions for forming roles are described in greater below, along with the required input for each such instruction, according to the output of previously described commands which are thus grouped together to form each role.

For example, the command ROLE_init_instruction requires the following input: a set of nodes to be created using the previously described command OM_create_nodes; a set of initial edges to be created using the previously described command OM_create_edges; and a set of constraints and their parameters to add to the DGM. The command ROLE_gen_field (field) performs the following functions: calls the command DGM_update_consistent_ranges with the value for {field}; generates a random value for field from its consistent range; sets the field to that value; and calls the command DGM_mark_as_changed with {field}. DGM_mark_as_changed will cause that field's status to become changed, indicating that the graph component connected to it is inconsistent and must be re-evaluated. Sometimes nodes might be dependent on values that are fixed, being previously generated, or non-generatable. These are called "dependent on fixed" or dof.

Yet another command is ROLE_gen_top, in which the following instructions are executed: get next node N from the OM using OM_get_next; if the picked node has a dof indication, then get dofs using the command OM_get_dofs; call the command DGM_update_consistent_ranges with the information about dofs in order to compute values for the dofs; and then call the command ROLE_gen_field (N), which computes a consistent value for N. The term "dof" means "dependent on fixed", which is a generatable field whose value depends upon either a previously generated field, or a field which cannot be generated. Thus, this command causes any such required field to be either generated, or to be determine to be unable to be generated.

Still another such command is ROLE_end_instruction, which is used for handling book-keeping to close OM frames, run checks to be certain that all open processes are closed, and so forth. In particular, this command ends the generation process for this particular struct in this particular context, or "role".

As previously described, roles may be either statically ordered or unordered. Using the above high level instructions, roles are mapped into sequences having one of these two forms. For example, statically ordered roles preferably have the following structure:

ROLE_init_instruction(nodes, edges, constraints)
ROLE_gen_field(field1)
ROLE_gen_field(field2)
ROLE_gen_field(fieldN)
ROLE_end_instruction By contrast, statically unordered roles preferably have the following different structure:

ROLE_init_instruction(nodes, edges, constraints)
    (number)*ROLE_gen_top
ROLE_end_instruction As previously described, since the same struct type might be generated in different contexts, with different applicable constraints, the GML sequence is not a property of the struct-type itself, but rather of the role according to which the sequence is to be generated.

Figure 3:
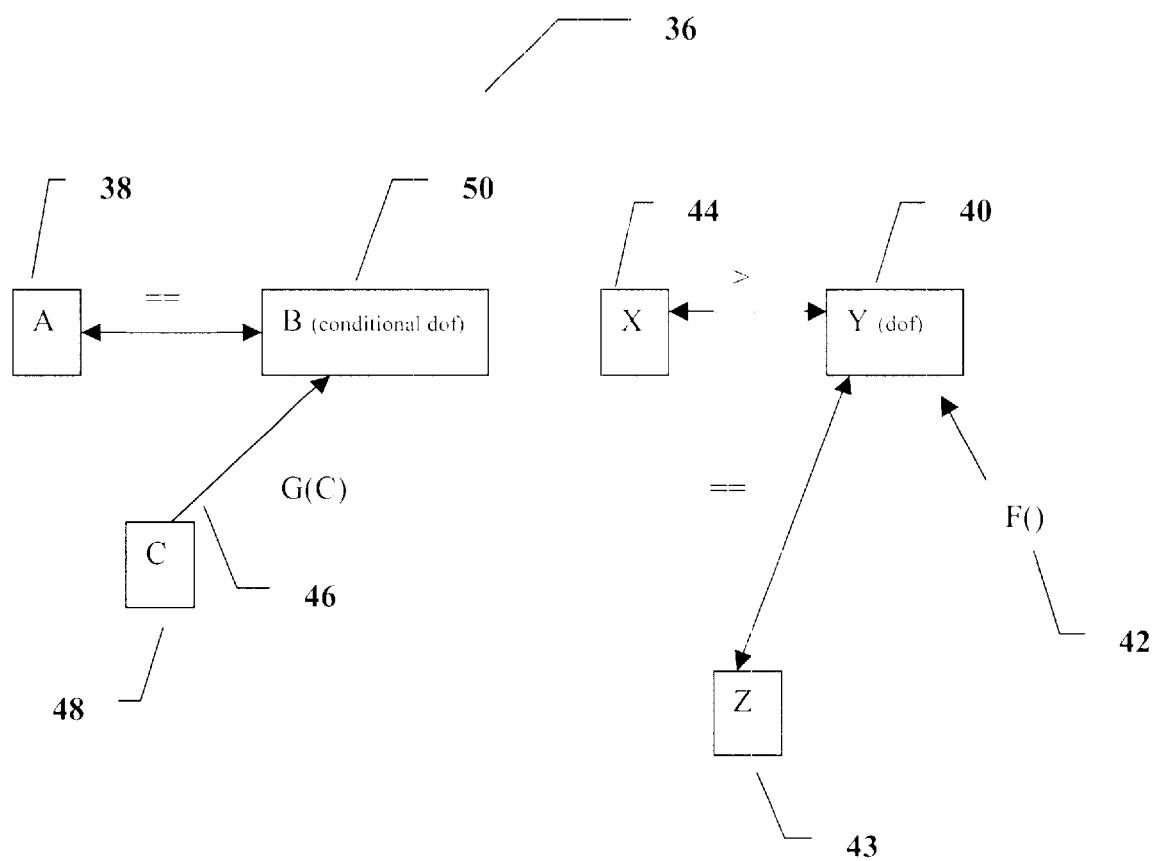
FIG. 3 is a schematic block diagram of a graph after construction according to the method of the present invention.

FIG. 3 shows a schematic block diagram of an exemplary dependency graph 36, produced according to the method described in greater detail below, resulting from a particular set of constraints. Briefly, for the purposes of this example, the order of fields is as follows: X, Y, Z, A, B, C. The following set of constraints is used:

Keep X>Y
Keep Y==Z
Keep Y F( )
Keep A==B
Keep (X>0)=>b==G(C),
    where F( ) and G( ) are functions.

Calling the function OM_get_next( ) on this constraint system returns a field A 38, but with a dof indication due to a field Y 40. Field Y 40 is computed using a function F( ) 42. The computed value of field Y 40 is propagated to fields Z 43 and X 44. At this point, the value for field X 44 is generated. Field Y 40 already has received the final value. Next the value for field Z 43 is computed.

Depending on the value of X, if X>0 a unidirectional edge 46 is added by calling OM_create_edge from C to B. In this case calling OM_get_next( ) returns a field C 48 because of the edge. Next, a final value for field C 48 is generated. At this point, a field B 50 is marked as a dof; being dependent on a fixed value. Calling OM_get_next( ) returns field A 38 with a dof indication. The returned dof is field B 50, which is evaluated using G(C), and the value so obtained is propagated to field A 38. At that time, the value for field A 38 is generated and the process terminates.

In the case where the value for field X 44 is generated to be less than 0, the generation order is A, B, C which is the order of fields.

While the invention has been described with respect to a limited number of embodiments, it will be appreciated that many variations, modifications and other applications of the invention may be made.

What is claimed is:

1. A system for dynamically solving constraints for test generation for a DUT (device under test), comprising:

(a) a data model for the DUT;
    (b) an abstract generation machine for solving the constraints by creating a plurality of static instructions for generating values for test generation before run-time, further comprising a constraint resolution engine for managing requirements imposed by the constraints on the test generation; and
    (c) a test generator for performing test generation according to said plurality of static instructions for generating values and according to said data model at run-time;
    wherein each constraint features at least one parameter and said constraint engine comprises a state machine for receiving said at least one parameter of each constraint and for creating at least one of said plurality of static instructions according to said at least one parameter of each constraint.

2. The system of claim 1, wherein said state machine has a plurality of elements and said constraint resolution engine features at least one dynamic graph for representing at least one element of said state machine, such that each constraint and each node is represented by a node of said at least one dynamic graph, and wherein a relationship between the constraints is represented by edges of said at least one dynamic graph.

3. The system of claim 2, wherein said constraint resolution engine further comprises:

(i) an order manager for managing a first dynamic graph for determining an order for executing said instructions; and
    (ii) a dynamic graph manager for managing a second dynamic graph for determining relationships between constraints in said instructions.

4. The system of claim 3, wherein said order is determined according to the constraints during test generation.

5. The system of claim 3, wherein said second dynamic graph is a dynamic bi-partite graph for relating nodes to constraints, wherein each node represents field ranges capable of being generated, such that said second dynamic graph maintains consistency between said field ranges.

6. The system of claim 5, wherein said dynamic graph manager reduces a number of said relationships between the constraints.

7. A method for dynamically solving a plurality of dynamic constraints for test generation for a DUT (device under test), each constraint featuring at least one parameter, the method for being performed by a data processor, the method:

creating at least one dynamic graph for describing the plurality of dynamic constraints, each node of said at least one dynamic graph representing a parameter, and each edge representing a relationship between constraints;

reducing a number of nodes for said at least one dynamic graph; and determining a path for traveling through said at least one dynamic graph to create a plurality of instructions for solving the dynamic constraints.

8. The method of claim 7, wherein said creating at least one dynamic graph further includes providing a second bi-partite graph, featuring two sets of nodes, a first set for said constraints and a second set for said parameters.

9. The method of claim 8, further comprising:

executing said plurality of instructions to form a single specific solution to the constraints.

10. The method of claim 8, further comprising:

translating said plurality of instructions into a particular computer programming language.

11. The method of claim 7, wherein said determining a path further comprises grouping at least a portion of said plurality of instructions into a role for representing a context for interpreting the constraints.

12. The method of claim 11, wherein said role is selected from the group consisting of statically ordered and unordered.

* * * * *